(12) United States Patent
Minz et al.

(10) Patent No.: US 7,755,387 B2
(45) Date of Patent: Jul. 13, 2010

(54) FPGA HAVING A DIRECT ROUTING STRUCTURE

(75) Inventors: Deboleena Minz, New Delhi (IN); Kailash Digari, Great Noida (IN)

(73) Assignee: Sicronic Remote KG, LLC, Wilmington, DE (US)

( * ) Notice: Subject to any disclaimer, the term of this patent is extended or adjusted under 35 U.S.C. 154(b) by 475 days.

(21) Appl. No.: 11/264,674

(22) Filed: Nov. 1, 2005

(65) Prior Publication Data

US 2006/0119388 A1    Jun. 8, 2006

(30) Foreign Application Priority Data

Nov. 1, 2004   (IN)   .................. 2177/DEL/2004

(51) Int. Cl.
*H01L 25/00*   (2006.01)
(52) U.S. Cl. ........................................ 326/41
(58) Field of Classification Search ............ 326/37, 326/38, 39, 40, 41, 47, 101
See application file for complete search history.

(56) References Cited

U.S. PATENT DOCUMENTS

| | | | |
|---|---|---|---|
| 5,933,023 A | 8/1999 | Young | |
| 6,104,208 A | 8/2000 | Rangasayee | |
| 6,204,687 B1 * | 3/2001 | Schultz et al. | 326/40 |
| 6,573,749 B2 | 6/2003 | New et al. | |
| 6,970,013 B1 * | 11/2005 | Cory | 326/38 |
| 2003/0005402 A1 * | 1/2003 | Bal | 716/16 |
| 2004/0018711 A1 * | 1/2004 | Madurawe | 438/598 |
| 2004/0186956 A1 * | 9/2004 | Perego et al. | 711/115 |
| 2005/0090865 A1 * | 4/2005 | Sun et al. | 607/2 |

* cited by examiner

*Primary Examiner*—Rexford N Barnie
*Assistant Examiner*—Thienvu V Tran (57) ABSTRACT

An improved FPGA having a direct interconnect structure to provide selective data routing without stressing the general-purpose routing resources and to enable high rate of data exchange within the FPGA. At least two IP cores are connected to each other through the direct interconnect structure to enable simultaneous data interaction among the ports of the IP cores and to provide configurable bus width routing between the IP cores, and a plurality of logic blocks connected to the IP cores through the direct interconnect structure to enable simultaneous data routing among the IP cores and the plurality of logic blocks.

19 Claims, 11 Drawing Sheets

FIG. 10

FPGA HAVING A DIRECT ROUTING STRUCTURE

FIELD OF THE INVENTION

The present invention relates to general-purpose routing resources and in particular to an implementation of a direct routing structure between complex IP cores in FPGA.

BACKGROUND OF THE INVENTION

Field Programmable Gate Array (FPGA) architecture comprises a programmable routing structure and an array of configurable logic blocks. The programmable routing matrix comprises means for connecting configurable logic blocks (hereafter referred to as logic blocks) to each other. An FPGA provides a combination of programmable logic and programmable connections to a general-purpose routing structure.

In conventional FPGAs, the Programmable Interconnect Points (PIPs) are turned on by loading appropriate values into configuration memory cells associated with the PIPs, thereby creating paths for routing and establishing the logic performed by the configurable logic blocks. The signals on the routing paths change dynamically as values are being written to and read from flip-flops. A large amount of data is exchanged between logic blocks involving complex arithmetic and logic operations. The general-purpose routing resources are used to implement the interconnects between complex logic blocks. Data between the blocks is routed through the available switch matrix structure in the FPGA.

An existing interface between complex logic blocks in FPGA is an interface between RAM and Digital Signal Processor (DSP) block. In conventional FPGAs the blocks of RAM are generated by configuring programmable parts of the FPGA. When the functionality of RAM is desired by multiple end users, it is economical to dedicate a portion of the chip to this purpose, thus allowing the particular function to be implemented at high density.

Signal processing applications require execution of complex arithmetic and logical operations within the Configurable Logic Blocks. These blocks include multiply and accumulate (MAC) units, memory blocks, multipliers, shift registers, adders.

Figure 1A:
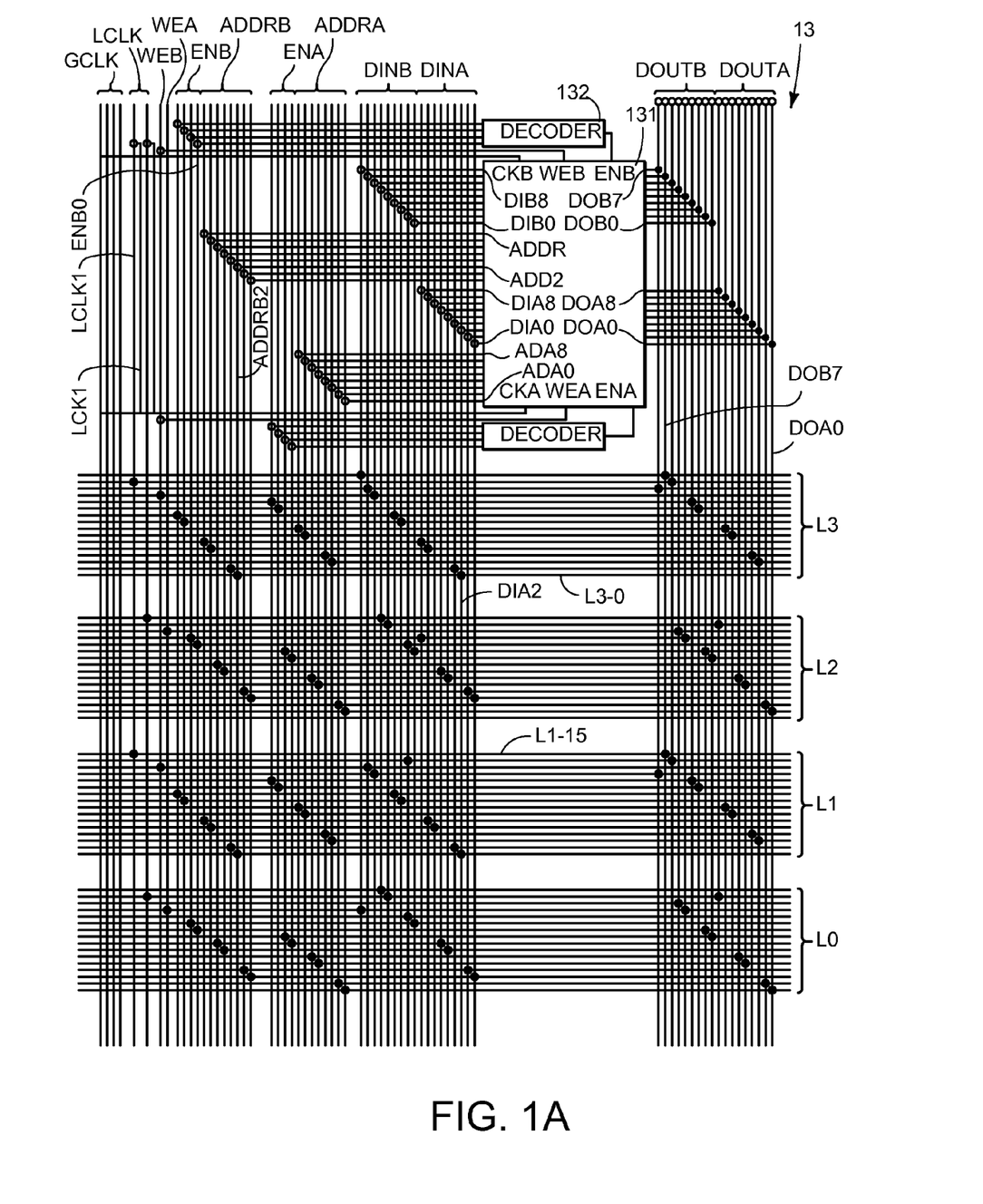
FIG. 1A illustrates an existing PRIOR ART structure of FPGA with embedded Random Access Memory according to U.S. Pat. No. 5,933,023.

U.S. Pat. No. 5,933,023 describing the existing structure of RAM blocks embedded in FPGAs, and is illustrated by FIG. 1A. The patent describes a structure in which blocks of RAM are integrated with Configurable Logic Blocks in FPGA. Routing lines which access configurable logic blocks also access address, data, and control lines in the RAM blocks. The logic blocks of the FPGA can use these routing lines to access portions of RAM. The routing lines allow RAM blocks and arrays of RAM blocks to be configured long, wide, or in between, and allow logic blocks to conveniently access RAM blocks in a remote part of the chip.

The drawback in the above said patent is that it cannot be used to provide an efficient routing structure between complex IP cores, where high rate of data exchange is required.

Figure 1B:
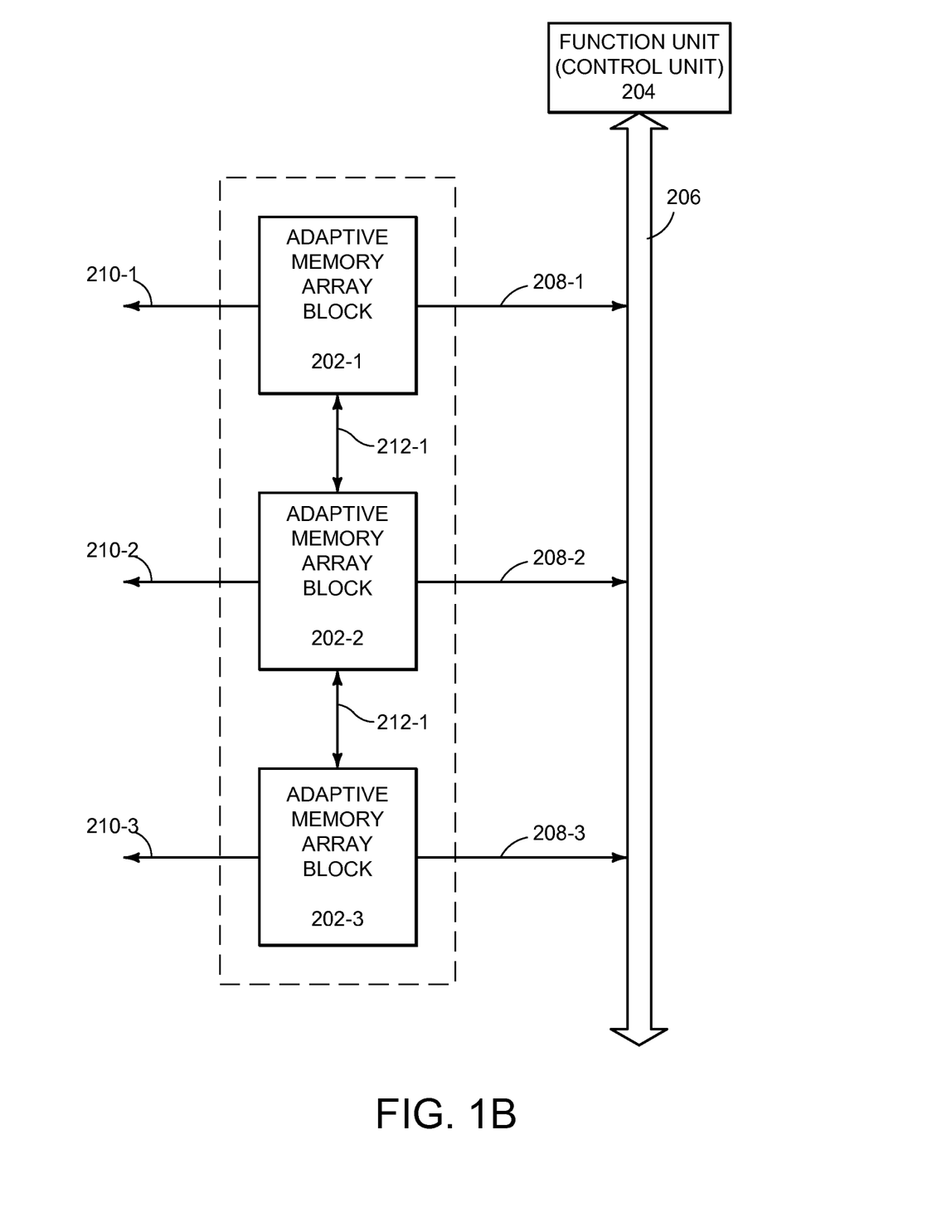
FIG. 1B illustrates the block diagram of an existing PRIOR ART configurable memory array according to U.S. Pat. No. 6,104,208.

FIG. 1B is a block diagram of a configurable memory array device 200 in accordance with U.S. Pat. No. 6,104,208, which describes the function specific blocks in detail. The configurable memory array device 200 comprises configurable memory array blocks 202 (202-1 through 202-3) connected to a functional block 204 by way of a signal bus 206. The signal bus 206 carries data and control signals, from the functional block 204 to the configurable memory array blocks (202-1 through 202-3) by using bi-directional signal lines 208-1 through 208-3. The configurable memory array blocks 202-1 through 202-3 respectively connect to external circuitry by way of bi-directional input/output (I/O) lines; 210-1 through 210-3.

The connectivity between the DSP block and the RAM blocks in U.S. Pat. No. 6,104,208 is not efficient and the connections have to be made using general-purpose routing resources, and Reconfigurable Interconnects are used for the purpose of routing.

Figure 1C:
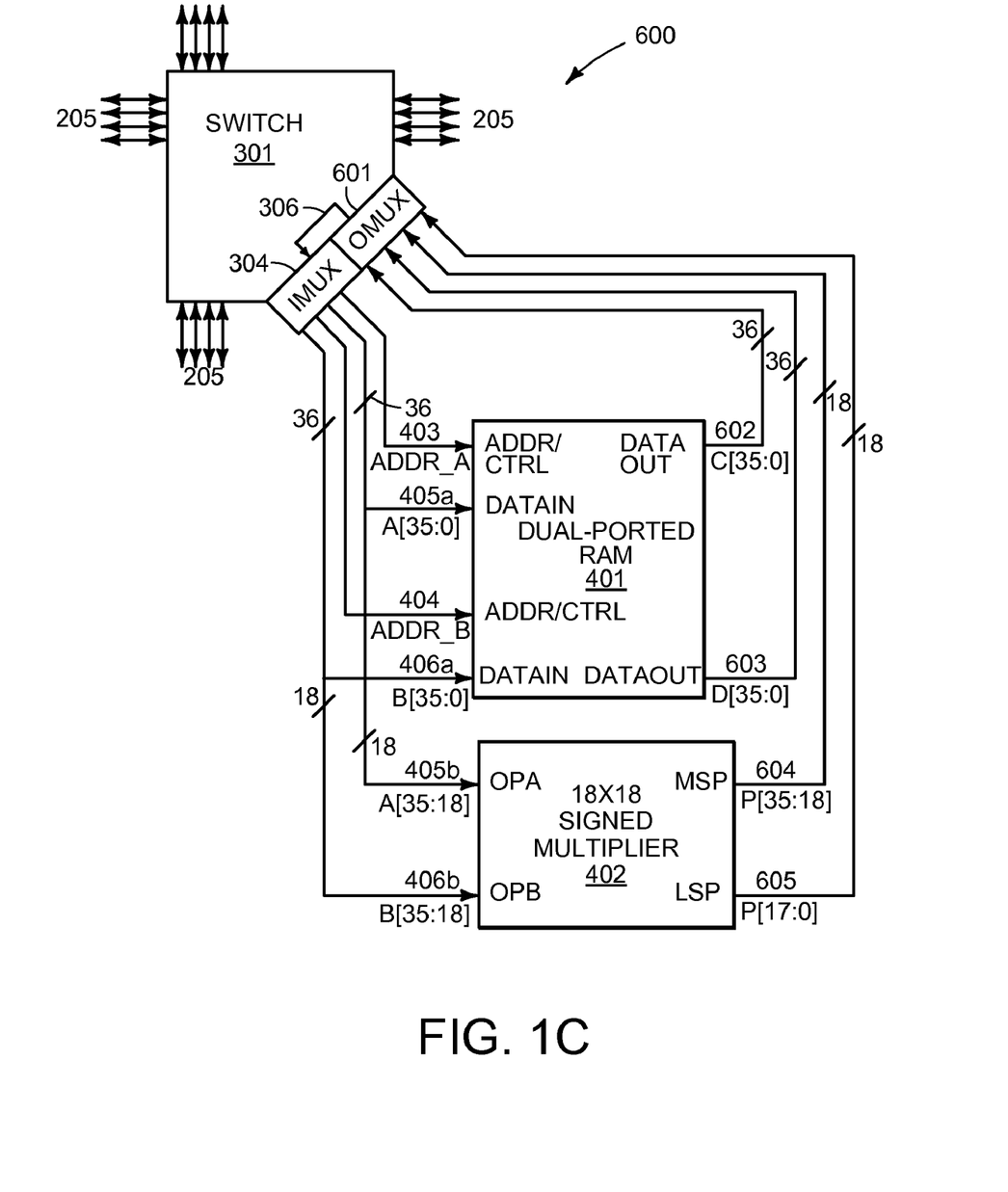
FIG. 1C illustrates the PRIOR ART multifunction tile in accordance with U.S. Pat. No. 6,573,749.

FIG. 1C shows the multifunction tile by Xilinx according to U.S. Pat. No. 6,573,749. The patent describes the method and apparatus of incorporating a multiplier into an FPGA. The invention provides an alternative structure that shares routing resources with a programmable structure having variable width. The document describes a multifunction tile and in one of the embodiments, the multifunction tile includes a configurable, dual-ported RAM and a multiplier that share the Input/Output resources of the multi-function tile. The RAM block and the multiplier block share their inputs bits and therefore, whenever the multiplier block is being used, the RAM block cannot be used in 32-bit mode.

The connectivity of the multiplier block and RAM block in the above discussed patent is such that whenever the multiplier block is being used, the associated RAM block can only be used in specific modes (18 bits or less). The multiplier inputs and outputs cannot be stored in the associated RAM block.

It is therefore felt that a direct interconnect structure is required between complex IP cores (Digital Signal Processors, Memory, High speed microprocessors) in FPGA, to avoid inefficient performance of general-purpose routing resources and for providing an integral connectivity between the complex IP cores and FPGA.

SUMMARY OF THE INVENTION

To address the above-discussed deficiencies of the prior art, it is an object of the present invention to provide a direct interconnect structure between complex IP cores in FPGA.

It is another object of the present invention to provide configurable bus width connectivity between the IP cores.

It is further an object of the present invention to provide simultaneous routing of data among the IP cores and the logic blocks in FPGA.

To achieve said objectives the present invention provides an improved FPGA having a direct routing structure, comprising:

a direct interconnect structure for providing selective data routing without stressing the general-purpose routing resources and enabling high rate of data exchange within the FPGA, at least two IP cores connected to each other through said direct interconnect structure for enabling simultaneous data interaction among the ports of said IP cores, and providing configurable bus width routing between said IP cores, and a plurality of logic blocks connected to said IP cores through said direct interconnect structure for enabling simultaneous data routing among said IP cores and said plurality of logic blocks.

Further, the present invention provides a method for implementing direct routing in FPGA, the method comprising steps of:

enabling simultaneous data interaction among ports of said IP cores through said direct interconnect structure, providing configurable bus width routing between said IP cores through the selectors of the direct interconnect structure, and simultaneously routing data among said IP cores and said plurality of logic blocks through the direct interconnect structure.

Thus, the present invention provides a direct an efficient routing structure between complex IP cores as signal processors and memory incorporated in FPGA.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. It should be noted that the functionality associated with any particular apparatus or controller may be centralized or distributed. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The present invention will be described with reference to and as illustrated by the accompanying drawings, in which like reference numerals represent like parts, and in which.

DETAILED DESCRIPTION OF THE INVENTION

FIGS. 2 through 10, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged FPGA or like circuitry.

FIG. 1 has been described under the heading 'Background of the Invention'.

Figure 2:
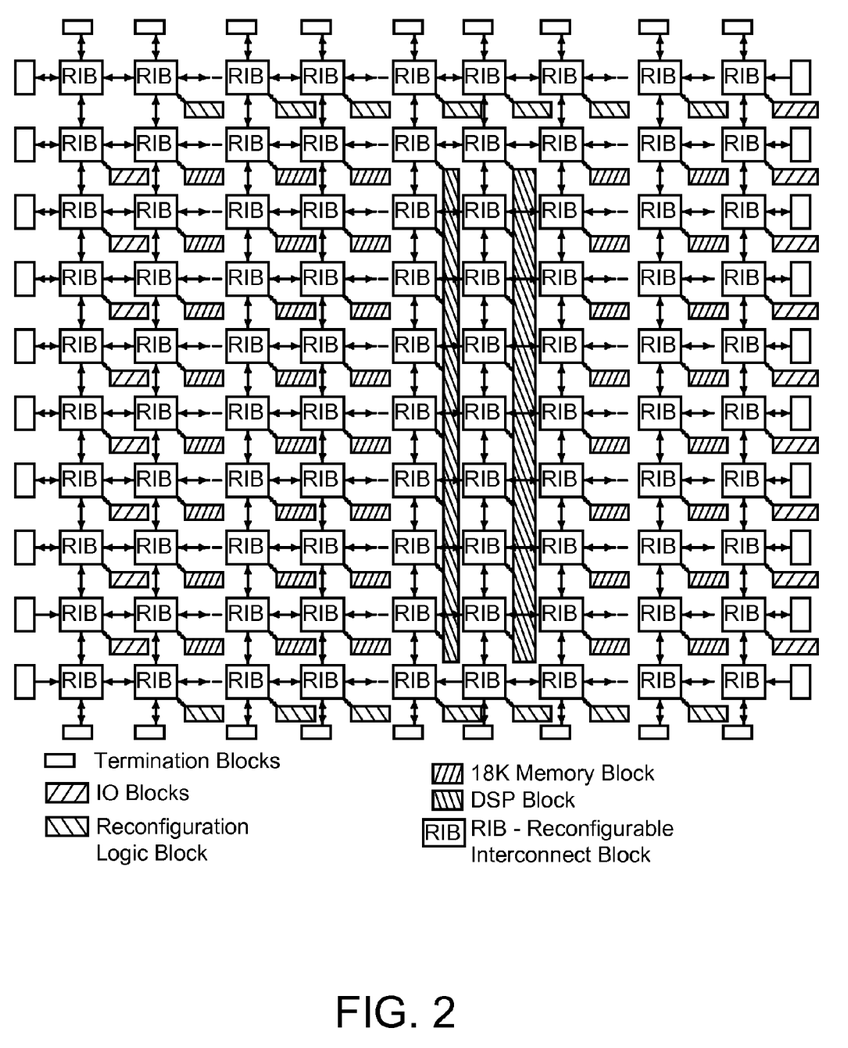
FIG. 2 illustrates the improved FPGA in accordance with the present invention.

The complex IP cores (hereafter referred to as memory block and DSP block) that are connected through the Direct Interconnect structure are implemented in the FPGA are shown in FIG. 2. FIG. 2 shows that the size of the memory block (RAM block) is 18 K bits, which comprises 16K data bits and 2K parity bits. The parity bits are available only in cross modes greater than or equal to eight (8). In the center of the FPGA is a plurality of Reconfigurable Logic Blocks (RLBs), separated periodically by columns of RAM blocks followed by the DSP blocks for providing routing between the Configurable Logic Blocks in FPGA. FIG. 2 also illustrates one column each of the RAM block and the DSP block. The RAM and DSP blocks span the height of eight (8) Reconfigurable Logic Blocks. Signals are exchanged between RAM blocks and the DSP blocks by using the Direct Interconnect structure as shown in the FIG. 2. The Direct Interconnect structure comprises a configurable routing structure and hardwired interconnect structure for providing direct routing with minimized delay. Hardwired interconnects in the direct routing structure obviate the routing delay that would have been caused by routing the IP cores through the conventional switch matrix structure. The configurable routing structure is elaborated with reference to FIGS. 5 and 6 in this document. RAM Block is configured to operate in multiple modes as a 512×32 array or as a 1028×16 array.

The RAM blocks illustrated in FIG. 2 are dual port RAM blocks with each of the ports individually configurable in multiple modes. Since, said RAM block can be used as 16K×1 array, the total number of address bits required to address the RAM block is 14. Thus, there are 28 address bits for the two ports of the memory and they operate as a single array for the two ports. Further, the total number of data bits for each port is 32.

Figure 3:
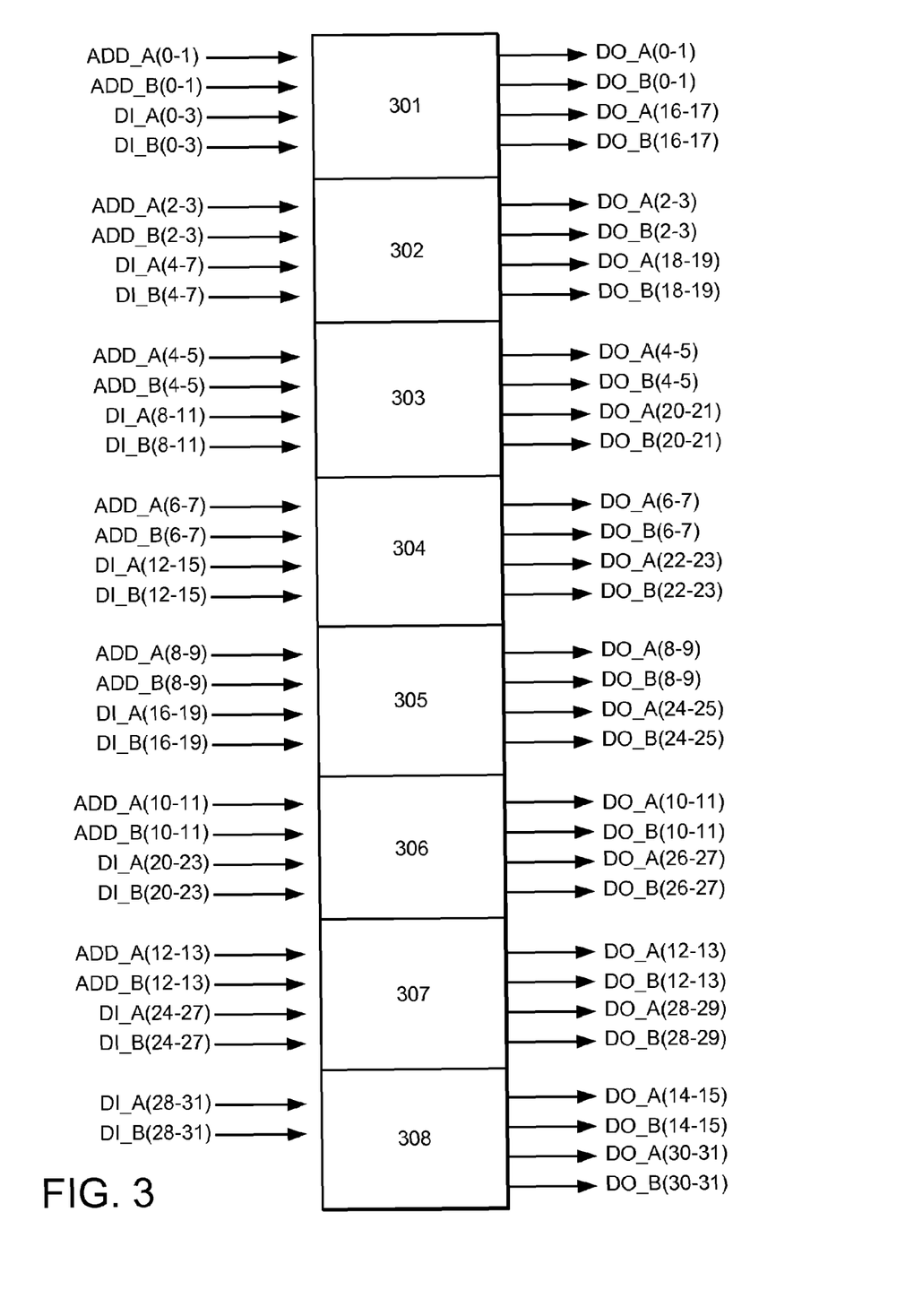
FIG. 3 illustrates the distribution of signals in the sub blocks of the memory block in accordance with the instant invention.

The RAM block comprises sub blocks (301 to 308) are shown in FIG. 3. These sub blocks interact with the multiple switch boxes of the general-purpose routing structure besides being connected to the DSP block through the Direct Interconnect structure. The I/O port structure of the RAM block comprises two input ports (Ports A and B) and an output port. The Conventional signals in said RAM block have not been illustrated for the sake of simplicity. The address bits are designated by variables ADD_A and ADD_B for port A and port B respectively, wherein the number following the variables specifies the order of address bits. The data input bits are designated by variables DI_A and DI_B respectively and the data output bits are designated by DO_A and DO_B for signals A and B respectively.

Figure 4:
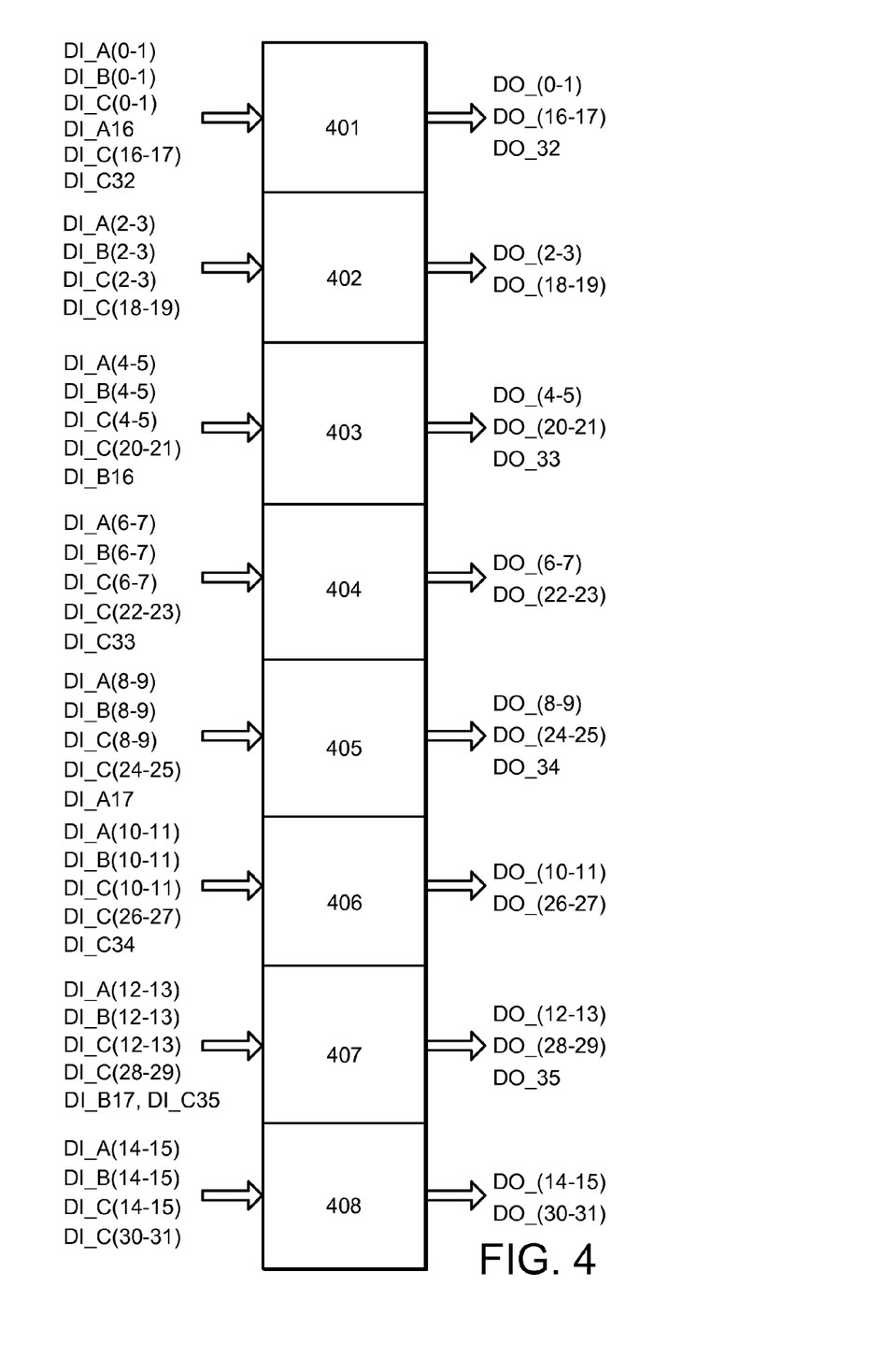
FIG. 4 illustrates the distribution of signals in the sub blocks of the signal-processing block in accordance with the instant invention.
Figure 5:
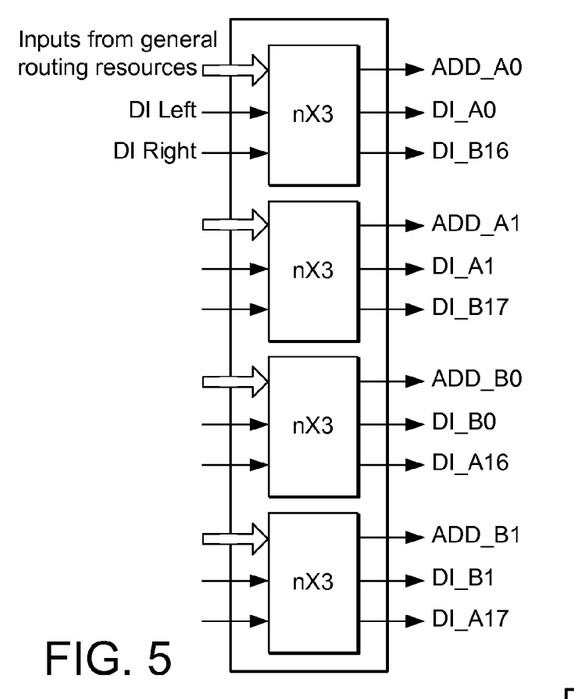
FIGS. 5 and 6 illustrate the input matrices of the direct interconnect structure according to the instant invention.

The DSP block comprises a plurality of sub blocks (401 to 408) and an I/O port structure comprising three input ports and an output port as shown in FIG. 4. Signals A and B are 18 bit wide, whereas signal C is 36 bit wide and the output bus is also 36 bits wide. Conventional signals in said DSP block have not been shown for the sake of simplicity. The Data Input bits are designated as DI and the number following them specifies the order of the data bits. The data output bits are designated as DO.

The configurable routing structure is herein (FIG. 5) described with reference to one sub block of the memory (RAM) block. The configurable routing structure comprises a selector (multiplexer) structure, wherein the selector structure comprises a plurality of logic selectors thus embodying a discrete selector structure. The selector structure in FIG. 5 comprises four logic selectors of size n×3, wherein n equals the number of inputs to the logic selectors in the selector structure. The select lines function for the multiplexers are provided by the configuration bits in the FPGA. The distribution of signals in the logic selectors is such that the address inputs for port A and B of the memory are distributed in the four logic selectors. It is therefore observed that all these signals can be routed simultaneously with the help of Direct Interconnects. These addresses can be generated in the reconfigurable logic blocks adjacent to the RAM block and can be routed through the Direct Interconnects.

The RAM block described here can be configured in any of the following modes: n×1, n×2, n×4, n×8, n×16, n×32, where n designates the number of bits in the array. It is further observed that in all these cases the lower data bits (0 to 15) are used in all the cases while the upper data (16 to 31) bits are used only in the n×32 mode.

Above said configurable bus width is achieved by using a discrete multiplexing logic (plurality of multiplexers) in the configurable routing structure. The upper data bits of port B and the lower data bits of port A are multiplexed to form one combination. Similarly, the upper data bits of port A and the lower data bits of port B are multiplexed together for providing a multi-port bi-directional data interaction among the IP cores and the configurable logic blocks in the FPGA.

The stated distribution of signals implies that the lower data bits of both the ports can be routed simultaneously into the RAM block using the Direct Interconnects without stressing the general purpose routing resources. Further, the 32 data bits of any one port (A or B) can be routed simultaneously using the Direct Interconnect Structure. The data bits may be generated in the logic blocks adjacent to the RAM blocks or may be computed in the DSP block also adjacent to the RAM block.

Figure 6:
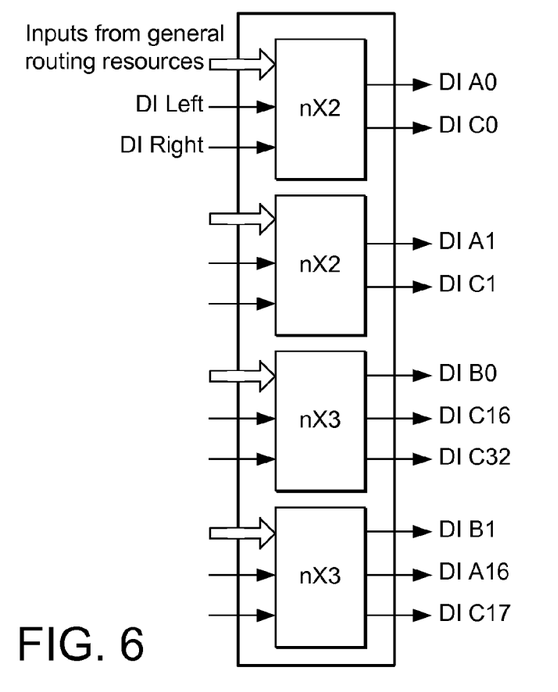

FIG. 6 shows the configurable routing structure interacting with a sub block of the DSP block. The routing structure herein described is similar to the routing structure of the RAM block and comprises four logic selectors of size n×2 and n×3. The routing structure receives inputs from the memory block and the DSP block. The DSP block takes three inputs namely, A, B and C of width 18, 18 and 36 respectively and operates on these signals and gives the following combination of output signals.

Out=(sigma)$A*B$

Or

Out=$A*B+C$

Figure 7A:
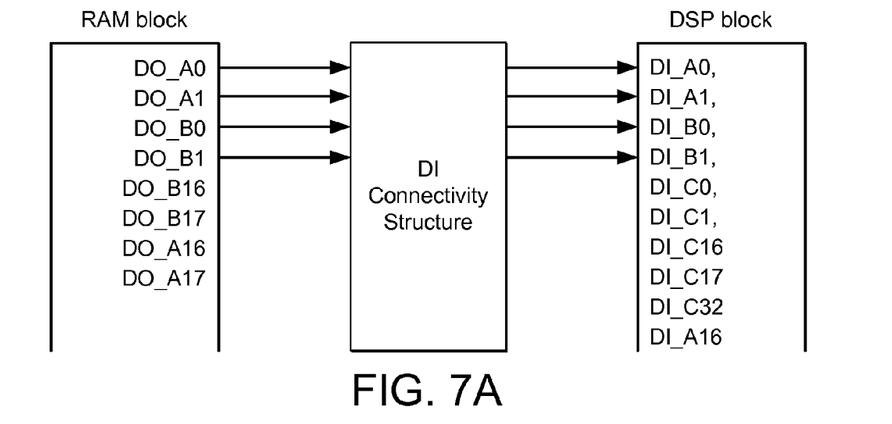
FIG. 7A illustrates the input port of the signal-processing block being driven by the memory block.
Figure 7B:
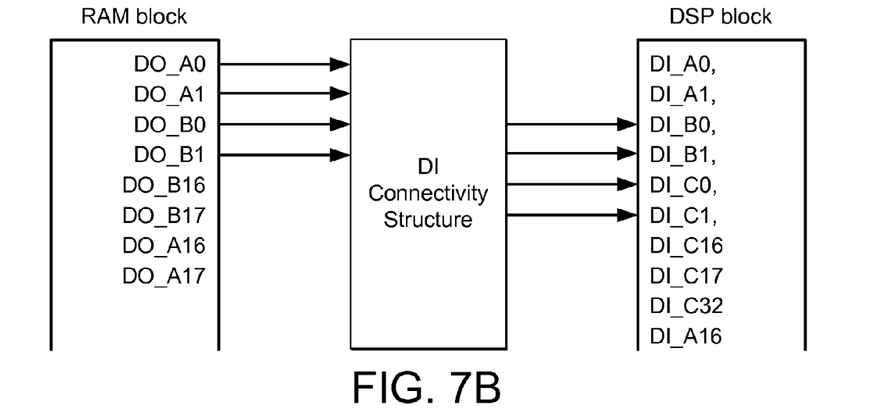
FIG. 7B illustrates the simultaneous routing between the memory block and the signal-processing block.
Figure 7C:
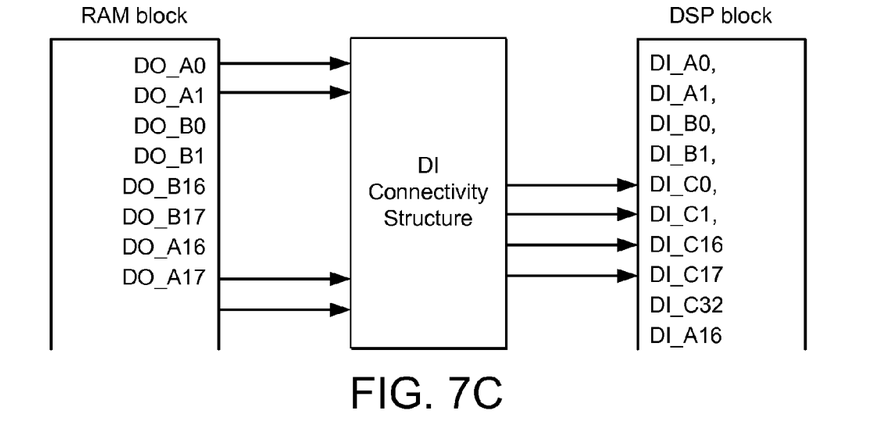
FIG. 7C illustrates the configurable bus width routing between the signal processing block and the memory block.

FIGS. 7A, 7B and 7C illustrate the method in which both A and B port outputs of RAM block can drive the A and B port inputs of the DSP block. The port names herein prefixed by DIs indicate the data input ports and those prefixed by DOs indicate data output ports. FIG. 7A shows the connectivity between the two bits each of ports A and B of the signal processor and memory. FIG. 7B shows that the B and C inputs of the DSP block are fed simultaneously. FIG. 7C shows that the 32 data bits of input C of the DSP block can be fed by the RAM block using the Direct Interconnect structure described in FIG. 6.

Figure 8A:
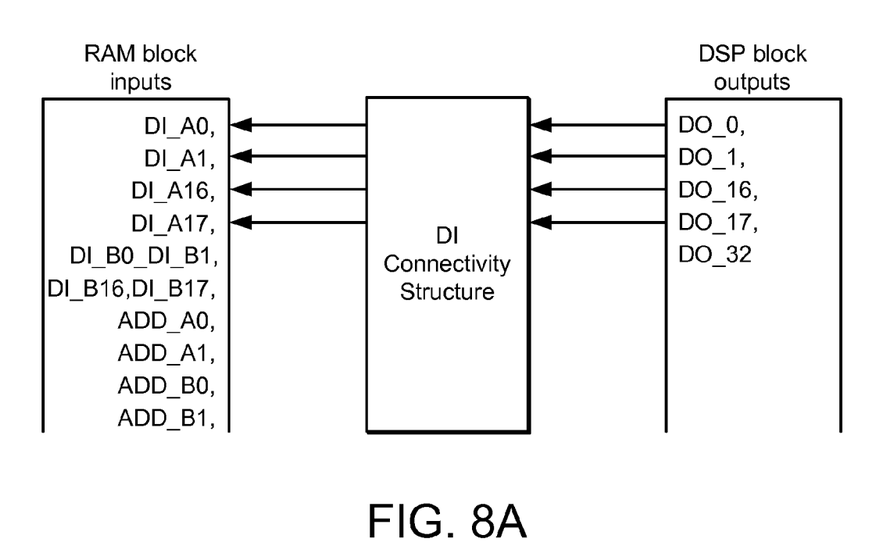
FIG. 8A illustrates the data routing from the output port of the signal-processing block to the first input port of the memory block.
Figure 8B:
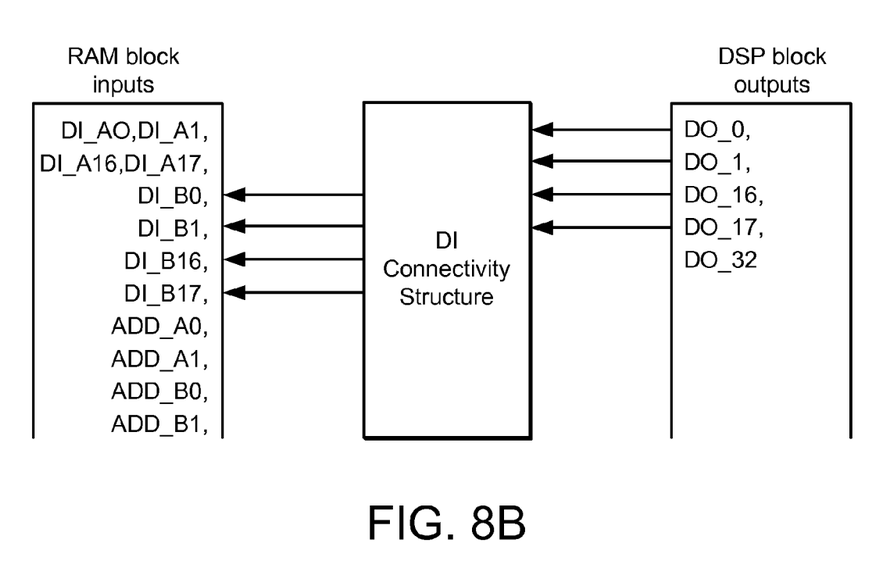
FIG. 8B illustrates the data routing from the output port of the signal-processing block to the second input port of the memory block.

FIGS. 8A and 8B show the routing combinations by which the DSP block outputs can feed the memory block address and data inputs. The flexible address bus accessibility in the figure further illustrating the configurable bus width routing. The port names (A, B) in above said figures that are prefixed by ADD signify the address inputs of the memory block, whereas the port names prefixed by DIs signify the data inputs of the memory block. The bi-directional connectivity between the DSP block and the memory block ensures a faster and efficient routing structure, which is essential for effective implementation of digital signal processing applications.

Above said routing combinations are explained explicitly as follows:
1) All the data bits of A, and all the data bits of B of the DSP block can be simultaneously routed from the memory block to the DSP block via Direct Interconnects.
2) All the data bits of A and the lower data bits of C of the DSP block can be routed form the RAM block to the DSP block.
3) All the data bits of C (except the last four bits i.e. parity bits) can be routed to the DSP block from the RAM block.
4) All the address bits of port A and port B of the RAM block can be simultaneously routed from the adjacent logic block.
5) All the data input bits of port A and port B of the RAM block can be simultaneously routed from the adjacent logic blocks.
6) All the outputs of DSP block (except for the last four bits) may drive the port A data input bits of RAM block.
7) All the outputs of DSP block (except for the last four bits) may drive the port B data input bits of RAM block.
8) All these signals may also be routed form the adjacent logic block via the Direct Interconnect structure.

Figure 9:
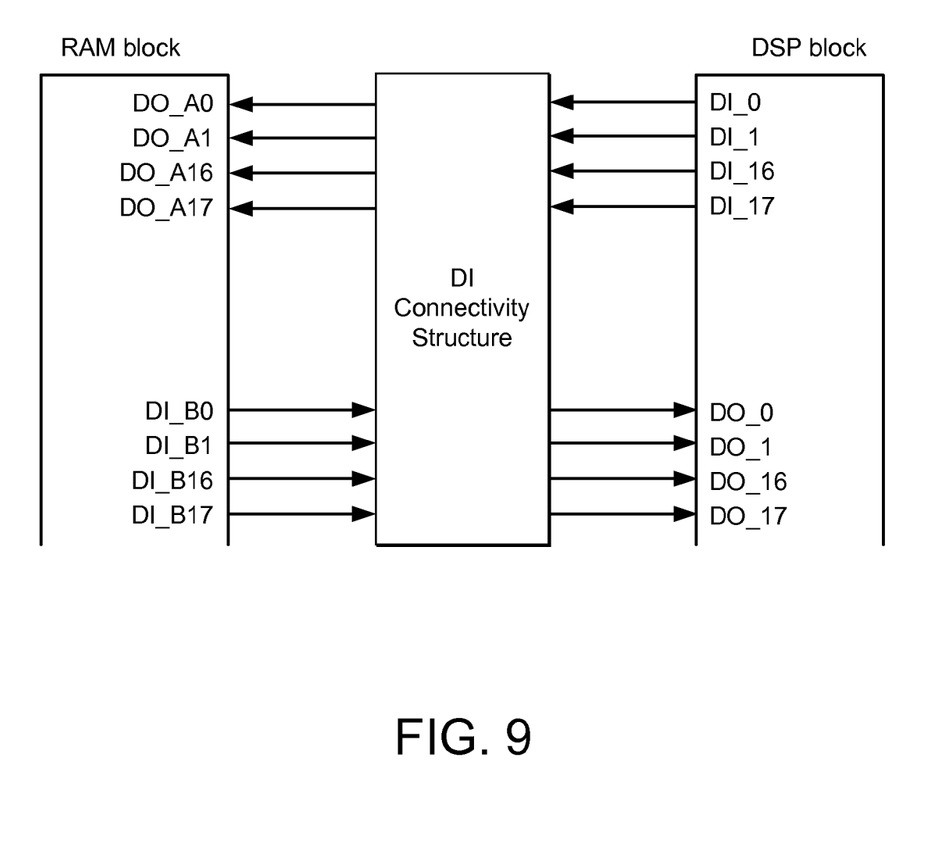
FIG. 9 illustrates the bi-directional data interaction between the memory and signal-processing block.
Figure 10:
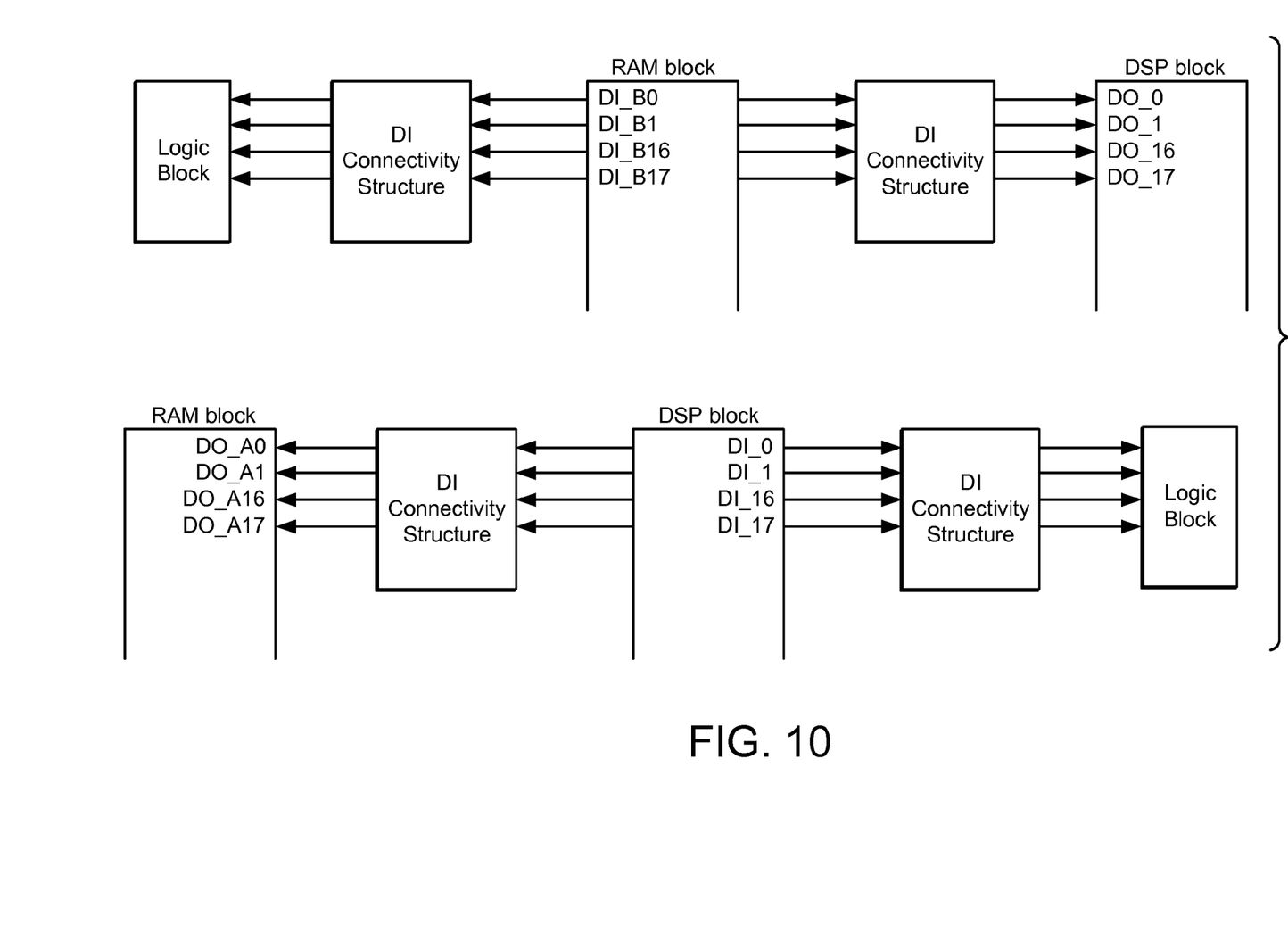
FIG. 10 illustrates the multi port connectivity among the memory, signal processing block and logic block.

The bi-directional data routing between the memory and the signal-processing block is further explained using FIG. 9. The plurality of logic selectors in the Direct Interconnect structure enable the bi-directional routing between complex IP cores.

The discrete structure of the logic selectors is significant in providing configurable bus width connectivity between the IP cores.

The DIs that signify the data inputs in the signal processing block are routed through the direct interconnect structure to the DOs of the memory block and are further routed to the logic block (FIG. 10), the logic block thus facilitating the minimal delay multiport data interaction among the IP cores (memory and signal processor) and the plurality of the logic blocks.

It is therefore observed that implementation of the network of Direct Interconnects between the RAM blocks, DSP blocks and the Reconfigurable Logic Blocks not only offer fast and efficient data exchange between them but also integrates these blocks to the core. This structure is significant in complex Digital Signal Processing Applications where the data computed in the DSP block needs to be stored in memory or the coefficients of filters are stored in memory and are required in the DSP block for computation. It is intended that the present invention encompass such changes and modifications as fall within the scope of the appended claims.

What is claimed is:

1. A field programmable gate array (FPGA) comprising a direct routing structure, the direct routing structure comprising:
    a direct interconnect structure for providing selective data routing without stressing general-purpose routing resources of the FPGA, the direct interconnect structure enabling higher rate of data exchange within the FPGA in comparison to the general-purpose routing resources;

at least two IP cores connected to each other through said direct interconnect structure and the general-purpose routing resources that are operable to provide configurable routing, said direct interconnect structure enabling data interaction among ports of said IP cores and providing bus routing of configurable width between said IP cores; and a plurality of logic blocks connected to said IP cores through said direct interconnect structure for enabling data routing, by selective data routing or through use of the general-purpose routing resources, among said IP cores and said plurality of logic blocks.

2. The structure of claim 1, wherein said IP cores comprise a memory and a digital signal processing (DSP) circuit.

3. The structure of claim 2, wherein said memory comprises read access memory (RAM).

4. The structure of claim 3, wherein said plurality of logic blocks are periodically separated by said RAM.

5. The structure of claim 1, wherein said direct interconnect structure comprises a configurable routing structure.

6. The structure of claim 1, wherein said direct interconnect structure comprises a hardwired interconnecting structure.

7. A field programmable gate array (FPGA) comprising:

a direct interconnect connection between a plurality of IP core ports and adjacent ones of a plurality of logic blocks, wherein the direct interconnect connection is configured to provide selective data routing at a higher rate of data exchange than general-purpose routing resources in the FPGA, wherein each of said IP core ports is associated with a memory and a digital signal processing (DSP) circuit that are useable to control data exchange occurring over the direct interconnect connection, and wherein said direct interconnect connection provides bus routing of configurable width and is implemented without stressing the general-purpose routing resources that connect said IP core ports and said logic blocks.

8. The FPGA of claim 7, wherein said memory comprises read access memory (RAM).

9. The FPGA of claim 8, wherein said plurality of logic blocks are periodically separated by said RAM.

10. The FPGA of claim 7, wherein said direct interconnect structure comprises a configurable routing structure.

11. The FPGA of claim 7, wherein at least two of said IP cores are connected to each other through said direct interconnect structure to enable simultaneous data interaction among the ports of said IP cores.

12. The FPGA of claim 7, wherein at least two of said IP cores are connected to each other through said direct interconnect structure to provide a configurable bus width routing between said IP cores.

13. The FPGA of claim 7, wherein said plurality of logic blocks are connected to said IP cores through said direct interconnect structure to enable simultaneous data routing between said IP cores and said plurality of logic blocks.

14. For use in a field programmable gate array (FPGA), a routing structure comprising:

a direct interconnect structure, between a plurality of logic blocks that are also connected using general-purpose routing resources of said FPGA, a plurality of memory blocks, and a digital signal processing (DSP) circuit, wherein said interconnect structure provides bus routing of configurable width and is implemented without stressing said general purpose routing resources, wherein the direct interconnect structure enables a higher rate of data exchange between said plurality of logic blocks in said FPGA than through the general-purpose routing resources, and wherein the plurality of memory blocks are usable by the digital signal processing circuit to set the bus routing of configurable width between individual ones of said plurality of logic blocks.

15. The routing structure of claim 14, wherein each of said memory blocks comprises read access memory (RAM).

16. The routing structure of claim 15, wherein said plurality of logic blocks are periodically separated by said RAM.

17. The routing structure of claim 14, wherein said direct interconnect structure comprises at least one of: a configurable routing structure and a hardwired interconnecting structure.

18. The routing structure of claim 14, wherein the FPGA includes at least two IP cores are connected to each other through said direct interconnect structure to enable simultaneous data interaction among the ports of said IP cores.

19. The routing structure of claim 14, wherein the FPGA includes at least two IP cores are connected to each other through said direct interconnect structure to provide a configurable bus width routing between said IP cores and to enable simultaneous data routing among said IP cores and said plurality of logic blocks.

* * * * *

UNITED STATES PATENT AND TRADEMARK OFFICE
CERTIFICATE OF CORRECTION

| | | |
|---|---|---|
| PATENT NO. | : 7,755,387 B2 | Page 1 of 1 |
| APPLICATION NO. | : 11/264674 | |
| DATED | : July 13, 2010 | |
| INVENTOR(S) | : Deboleena Minz et al. | |

It is certified that error appears in the above-identified patent and that said Letters Patent is hereby corrected as shown below:

On the Title page, Item (75), Inventors, delete "Great" and insert -- Greater --, therefor.

In the drawings, sheet 9 of 11, (FIG. 8B), below RAM block inputs, delete "AO," and insert -- A0, --, therefor.

Signed and Sealed this

Twenty-sixth Day of October, 2010

David J. Kappos
*Director of the United States Patent and Trademark Office*